(12) United States Patent
Wang et al.

(10) Patent No.: US 11,769,685 B2
(45) Date of Patent: Sep. 26, 2023

(54) MANUFACTURING METHOD OF SEMICONDUCTOR PACKAGE

(71) Applicant: Innolux Corporation, Miao-Li County (TW)

(72) Inventors: Cheng-Chi Wang, Miao-Li County (TW); Wen-Hsiang Liao, Miao-Li County (TW); Yeong-E Chen, Miao-Li County (TW); Hung-Sheng Chou, Miao-Li County (TW); Cheng-En Cheng, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 70 days.

(21) Appl. No.: 17/520,599

(22) Filed: Nov. 5, 2021

(65) Prior Publication Data

US 2022/0181189 A1     Jun. 9, 2022

(30) Foreign Application Priority Data

Dec. 3, 2020    (CN) .......................... 202011395786.3

(51) Int. Cl.
*H01L 21/683*    (2006.01)
*H01L 21/48*    (2006.01)

(52) U.S. Cl.
CPC ...... *H01L 21/6836* (2013.01); *H01L 21/4853* (2013.01); *H01L 2221/68354* (2013.01); *H01L 2221/68363* (2013.01)

(58) Field of Classification Search
CPC ..... H01L 21/6836; H01L 24/75; H01L 24/13; H01L 24/16; H01L 2224/131; H01L 2224/13155; H01L 2224/13157; H01L 2224/16225; H01L 24/81; H01L 24/95; H01L 25/0655; H01L 21/6835; H01L 2221/68368; H01L 2224/13124; H01L 2224/13163; H01L 2224/13166; H01L 2224/1317; H01L 2224/13171; H01L 2224/13179; H01L 2224/1318;
(Continued)

(56) References Cited

U.S. PATENT DOCUMENTS 6,498,051 B1 * 12/2002 Watanabe ............... H01L 24/83
                                                      438/106
7,239,068 B2 * 7/2007 Miyaji ..................... H03H 3/08
                                                      310/344
(Continued)

FOREIGN PATENT DOCUMENTS

JP          5026492          9/2012

*Primary Examiner* — Vu A Vu
(74) *Attorney, Agent, or Firm* — JCIPRNET

(57) ABSTRACT

A manufacturing method of a semiconductor package is provided. The manufacturing method includes the following. A plurality of semiconductor components are provided. Each semiconductor component has at least one conductive bump. A substrate is provided. The substrate has a plurality of conductive pads. A transfer device is provided. The transfer device transfers the semiconductor components onto the substrate. A heating device is provided. The heating device heats or pressurizes at least two semiconductor components. During transferring of the semiconductor components to the substrate, the at least one conductive bump of each semiconductor component is docked to a corresponding one of the conductive pads.

17 Claims, 10 Drawing Sheets

(58) Field of Classification Search
CPC . H01L 2224/13181; H01L 2224/13184; H01L 2224/75; H01L 2224/75252; H01L 2224/7531; H01L 2224/7598; H01L 2224/81191; H01L 2224/81203; H01L 2224/81399; H01L 2224/95; H01L 21/67144; H01L 24/27; H01L 25/50; H01L 2221/68372; H01L 2224/81097
USPC ........................................................ 438/125
See application file for complete search history.

(56) References Cited

U.S. PATENT DOCUMENTS

| | | | |
|---|---|---|---|
| 9,941,262 B2* | 4/2018 | Thompson | H01L 33/486 |
| 10,607,877 B2* | 3/2020 | Lee | H01L 21/67115 |
| 10,636,937 B2* | 4/2020 | Liao | H01L 33/0095 |
| 10,818,643 B1* | 10/2020 | Brodoceanu | H01L 21/6835 |
| 10,991,846 B2* | 4/2021 | Ting | H01L 33/0093 |
| 2009/0127315 A1* | 5/2009 | Okita | H01L 24/75 |
| | | | 228/9 |
| 2013/0140592 A1* | 6/2013 | Lee | H01L 33/22 |
| | | | 257/E33.062 |
| 2013/0267055 A1* | 10/2013 | Ro | C23C 14/04 |
| | | | 427/532 |
| 2020/0243356 A1* | 7/2020 | Nakamura | H01L 24/94 |
| 2021/0005588 A1* | 1/2021 | Chung | H01L 24/95 |
| 2022/0093557 A1* | 3/2022 | Liao | H01L 23/345 |

* cited by examiner

MANUFACTURING METHOD OF SEMICONDUCTOR PACKAGE

CROSS-REFERENCE TO RELATED APPLICATION

This application claims the priority benefit of Chinese application no. 202011395786.3, filed on Dec. 3, 2020. The entirety of the above-mentioned patent application is hereby incorporated by reference herein and made a part of this specification.

BACKGROUND

Technical Field

An embodiment of the disclosure relates to a manufacturing method of a package, and more particularly, to a manufacturing method of a semiconductor package.

Description of Related Art

As application of electronic devices continually increases and widens, development of display technology is also ever-changing. With different conditions of manufacturing process, requirements for packaging structure and quality of the electronic devices gradually increase, and then different issues arise as regards the electronic devices. Therefore, research and development of electronic devices also needs to be continually updated and adjusted.

SUMMARY

The disclosure is directed to a manufacturing method of a semiconductor package, in which the manufacturing process may be simplified, time may be reduced, thermal conductivity may be improved, or package quality may be enhanced.

According to an embodiment of the disclosure, a manufacturing method of the semiconductor package includes the following. A plurality of semiconductor components are provided. Each semiconductor component has at least one conductive bump. A substrate is provided. The substrate has a plurality of conductive pads. A transfer device is provided. The transfer device transfers the semiconductor components onto the substrate. A heating device is provided. The heating device heats or pressurizes at least two semiconductor components. During transferring of the semiconductor components to the substrate, the at least one conductive bump of each semiconductor component is docked to a corresponding one of the conductive pads.

In summary of the foregoing, in the manufacturing method of a semiconductor package according to an embodiment of the disclosure, since the plurality of semiconductor components may be transferred onto the substrate, the mass transfer process may be achieved on a large-size substrate. In this way, the manufacturing process of the semiconductor package may be simplified or the manufacturing process time may be reduced. In addition, the step of heating or the step of pressurizing may be performed on the plurality of semiconductor components through the heating device in the manufacturing process, further simplifying the manufacturing process or reducing the manufacturing process time. Moreover, compared with heating on the other side of the substrate opposite to the side where the semiconductor components are disposed, in the embodiment of the disclosure, the plurality of semiconductor components are heated through the heating device, accelerating the temperature increase or improving uniformity of the temperature increase for the semiconductor package on the whole. Therefore, in the manufacturing process, thermal conductivity may be improved, probability of warping of the substrate may be reduced, or package quality may be enhanced. Furthermore, metal-to-metal docking may be achieved between the conductive pads and the conductive bumps of the semiconductor package, improving electrical quality or reliability of the semiconductor package.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
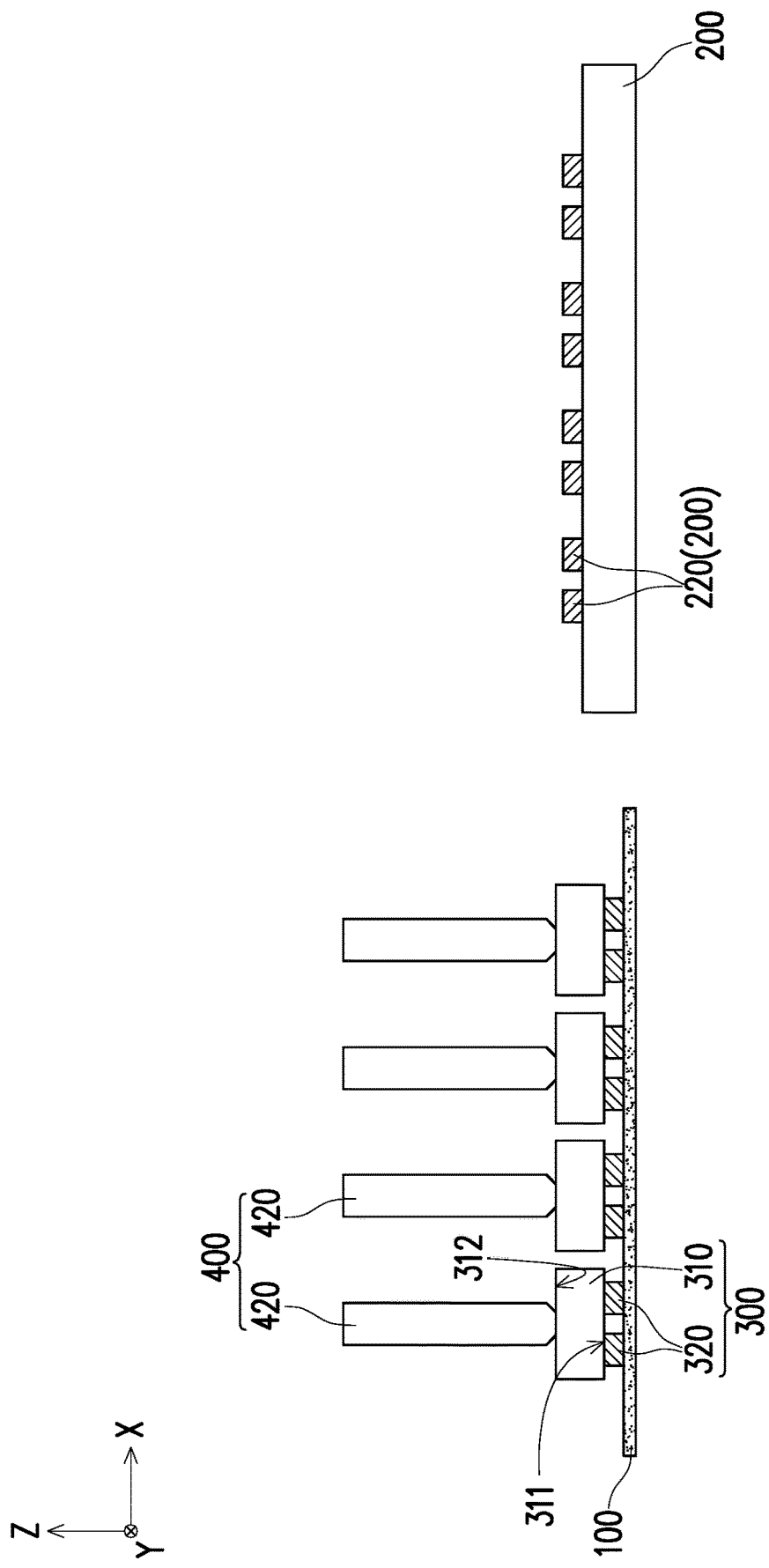
FIG. 1 to FIG. 7 are schematic cross-sectional views of a manufacturing process of a semiconductor package according to an embodiment of the disclosure.

The disclosure may be understood by referring to the following detailed description in conjunction with the accompanying drawings. Note that, to facilitate understanding and for simplicity of illustration, several of the drawings in the disclosure only illustrate a part of an electronic device, and some particular components are not illustrated to the actual scale. In addition, the number and size of the components shown in the drawings are exemplary and are not intended to limit the disclosure.

Throughout the description and the appended claims, certain terms are used to refer to specific components. Those skilled in the art should understand that electronic apparatus manufacturers may refer to the same component by different terms. The present specification does not intend to distinguish between components that differ in name but not function. In the following description and the claims, terms such as "comprise", "include", and "have" are open-ended and should be interpreted as "include but not limited to." Therefore, when the terms "comprise", "include", and/or "have" are used in the description of the disclosure, they specify the existence of corresponding features, regions, steps, operations, and/or members, but does not exclude the existence of one or more corresponding features, regions, steps, operations, and/or members.

Directional terms used herein, such as "upper," "lower," "front," "rear," "left" and "right," merely refer to directions in the accompanying drawings. Therefore, the directional terms are used to illustrate rather than limit the disclosure. In the drawings, general features of methods, structures and/or materials used in particular embodiments are illustrated. However, these drawings should not be construed as defining or limiting the scope or nature covered by these embodiments. For example, for the sake of clarity, the relative sizes, thicknesses, and positions of film layers, regions, and/or structures may be reduced or enlarged.

It should be understood that when a component or film layer is referred to as being "connected to" another component or film layer, it may be directly connected to said another component or film layer, or there may exist an intervening component or film layer between the two. When a component is referred to as being "directly connected to" another component or film, intervening components or film layers are absent between the two. In addition, when a member is referred to as being "coupled to another member (or a variant thereof)", it may be directly connected to said another member, or indirectly connected (e.g., electrically connected) to said another component through one or more members.

In the disclosure, the measurement of length and width may be obtained by adopting an optical microscope, and thickness may be obtained by measuring the profile image in an electron microscope, but not limited thereto. In addition, there may exist a certain error between any two values or directions for comparison.

The term "about", "equal to", "equal" or "same", "substantially" or "roughly" is generally interpreted as representing a range within 20% of a given value, or interpreted as representing a range within 10%, 5%, 3%, 2%, 1%, or 0.5% of a given value.

In the disclosure, the description that one structure (or layer, component, substrate) is located on another structure (or layer, component, substrate) may refer to that the two structures are adjacent and directly connected, or may refer to that the two structures are adjacent but not directly connected. Not being directly connected means that at least one intermediary structure (or intermediary layer, intermediary component, intermediary substrate, intermediary interval) exists between the two structures, and a lower surface of one structure is located adjacent to or directly connected to an upper surface of the intermediary structure, and an upper surface of the other structure is located adjacent to or directly connected to a lower surface of the intermediary structure. The intermediary structure may be composed of a single-layer or multi-layer physical structure or a non-physical structure, which is not limited by the disclosure. In the disclosure, when a certain structure is "on" another structure, it may mean that a certain structure is "directly" on another structure, or that a certain structure is "indirectly" on another structure, namely at least one structure is further sandwiched between a certain structure and another structure.

In the disclosure, "first", "second", and similar terms are used to describe components, members, regions, layers and/or parts, but these components, members, regions, and/or parts should not be limited by these terms. These terms are merely used to differentiate one component, member, region, layer and/or part from another component, member, region, layer and/or part. Therefore, the "first component", "member", "region", "layer", or "part" in the discussion below are used to separate from the "second component", "member", "region", "layer", or "part", but not used to limit the sequence or a specific component, member, region, layer and/or part.

According to the embodiments of the disclosure, an electronic device achieves displaying through a semiconductor package. The electronic device may include a display device, an antenna device, a sensing device, a splicing device or a transparent display device, but not limited thereto. The electronic device may be a rollable, stretchable, bendable or flexible electronic device. The electronic device may include, for example, a liquid crystal, light-emitting diode (LED), quantum dot (QD), fluorescence, phosphor or other suitable materials that may be arbitrarily arranged and combined, or other suitable display medium, or a combination of the above. The light-emitting diode may include, for example, an organic light-emitting diode (OLED), mini LED, micro LED or quantum dot (QD) LED (e.g., QLED or QDLED), but not limited thereto. The antenna device may be, for example but not limited to, a liquid crystal antenna. The splicing device may be, for example but not limited to, a display splicing device or an antenna splicing device. Note that the electronic device may be any arrangement or combination of the above, but not limited thereto. In addition, the appearance of the electronic device may include a rectangular, circular, or polygonal shape, a shape with curved edges, or other suitable shapes. The electronic device may have peripheral systems such as a driving system, control system, light source system, or shelf system to support a display device, antenna device, or splicing device. Hereinafter, the disclosure will be described with, but not limited to, a semiconductor package.

In the disclosure, the embodiments described below may mixed or combined for use without departing from the spirit and scope of the disclosure. For example, some features of one embodiment may be combined with some features of another embodiment to form still another embodiment.

Reference will now be made in detail to exemplary embodiments of the disclosure, examples of which are illustrated in the accompanying drawings. Wherever possible, the same reference numerals are used in the drawings and the description to refer to the same or like parts.

FIG. 1 to FIG. 7 are schematic cross-sectional views of a manufacturing process of a semiconductor package according to an embodiment of the disclosure. For clarity of the drawings and ease of description, illustration of some components is omitted in FIG. 1 to FIG. 7. First, with reference to FIG. 7, in the disclosure, a semiconductor package 10 includes a substrate 200 and a plurality of semiconductor components 300. Conductive bumps 320 of the semiconductor components 300 are docked to a plurality of conductive pads 220 on the substrate 200. In some embodiment, the semiconductor package 10 may be a wafer-level package (WLP) or fan-out panel-level package (FOPLP), but not limited thereto. Under the above configuration, in the manufacturing method of the semiconductor package 10 of this embodiment, the mass transfer process may be achieved on a large-size panel. In addition, in some embodiments, in the manufacturing method of the semiconductor package 10, the manufacturing process may be simplified or the manufacturing process time may be reduced. In other embodiments, in the manufacturing method of the semiconductor package 10, thermal conductivity may be improved or package quality may be enhanced. In the following, the manufacturing method of the semiconductor package 10 will be briefly described with an embodiment.

With reference to FIG. 1, the manufacturing method of the semiconductor package 10 includes the following. First, the plurality of semiconductor components 300 are provided. In some embodiments, after being singulated from a wafer, the semiconductor components 300 may first be disposed on a carrier 100. The semiconductor components 300 may be disposed on the carrier 100 in the direction of an X axis. A Z axis is perpendicular to the X axis, and may be the normal direction of the carrier 100. A Y axis is perpendicular to the X axis or the Z axis. The carrier 100 may be a glass substrate, but is not limited thereto. In some embodiments, the carrier 100 may be a dicing tape or a die attach film (DAF), but is not limited thereto.

The semiconductor component 300 is, for example, a chip. Each semiconductor component 300 includes a main body 310 and at least one conductive bump 320 disposed on the main body 310. The main body 310 has an active surface 311 and a passive surface 312 opposite to the active surface 311. The at least one conductive bump 320 includes, for example, a plurality of conductive bumps, and the conductive bumps 320 are disposed on the active surface 311. The conductive bump 320 is, for example but not limited to, a pad, a solder ball, or a controlled collapse chip connection (C4). In some embodiments, the conductive bump 320 may be a single layer of metal or a stack layer of multiple layers of metal, but is not limited thereto. The material of the conductive bump 320 may include molybdenum (Mo), tantalum (Ta), niobium (Nb), hafnium (Hf), nickel (Ni), chromium (Cr), cobalt (Co), zirconium (Zr), tungsten (W), aluminum (Al), titanium (Ti), copper (Cu), other suitable metals, or alloys or combinations of the above materials. In some embodiments, the conductive bump 320 is, for example, a copper bump.

Next, the substrate 200 is provided. For example, the substrate 200 may include a redistribution layer (RDL). The redistribution layer (RDL) includes multiple conductive layers and multiple dielectric layers (not shown) alternately stacked in the direction of the Z axis (e.g., the normal direction of the substrate 200). The conductive layer is, for example, a metal layer, and the material thereof includes molybdenum, tantalum, niobium, hafnium, nickel, chromium, cobalt, zirconium, tungsten, aluminum, titanium, copper, or other suitable metals or alloys or combinations of the above materials. The conductive layer is, for example but not limited to, a single metal layer or a stack layer structure having multiple sub-metal layers stacked. The material of the dielectric layer may include a photosensitive polyimide material, an organic polymer material, a photoresist material, or other suitable materials. In some embodiments, the material of the dielectric layer may include polycarbonate (PC), polypropylene (PP), polyethylene terephthalate (PET), silicon nitride, silicon oxide, silicon oxynitride, or other suitable materials or a combination of the above materials, but not limited thereto. The dielectric layer is, for example but not limited, a single layer or a stack structure of multiple layers stacked.

In some embodiments, the multiple dielectric layers may isolate the corresponding multiple conductive layers. A plurality of conductive vias may penetrate through the multiple dielectric layers to be coupled to the corresponding multiple conductive layers. Under the above configuration, the multiple conductive layers may be electrically connected to each other to function as redistribution circuits.

In some embodiments, the substrate 200 is, for example, of a panel-level size. For example, the size of the substrate 200 may be 620 millimeters (mm)×750 millimeters (mm), but is not limited thereto. In other words, in the embodiment of the disclosure, the packaging process may be regarded as being performed on a large-size substrate.

With reference to FIG. 1 again, the substrate 200 has the plurality of conductive pads 220. The conductive pads 220 of the substrate 200 are located on the uppermost surface of the substrate 200, but not limited thereto. In some embodiments, the conductive pads 220 are electrically connected to the uppermost conductive layer of the substrate 200. In other words, the conductive pads 220 are, for example but not limited to, pads on the uppermost layer in a redistribution layer structure.

Figure 2:
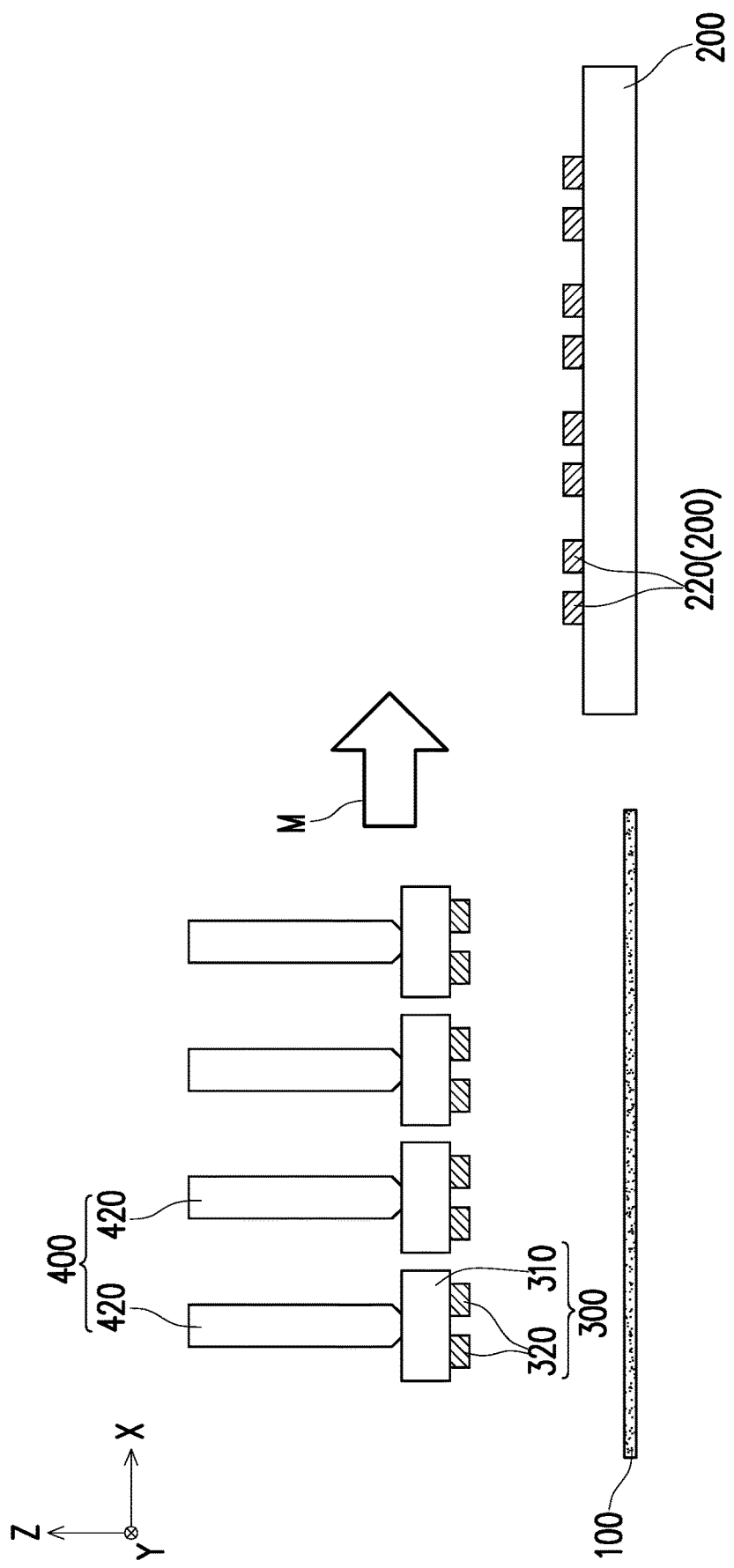
Figure 3:
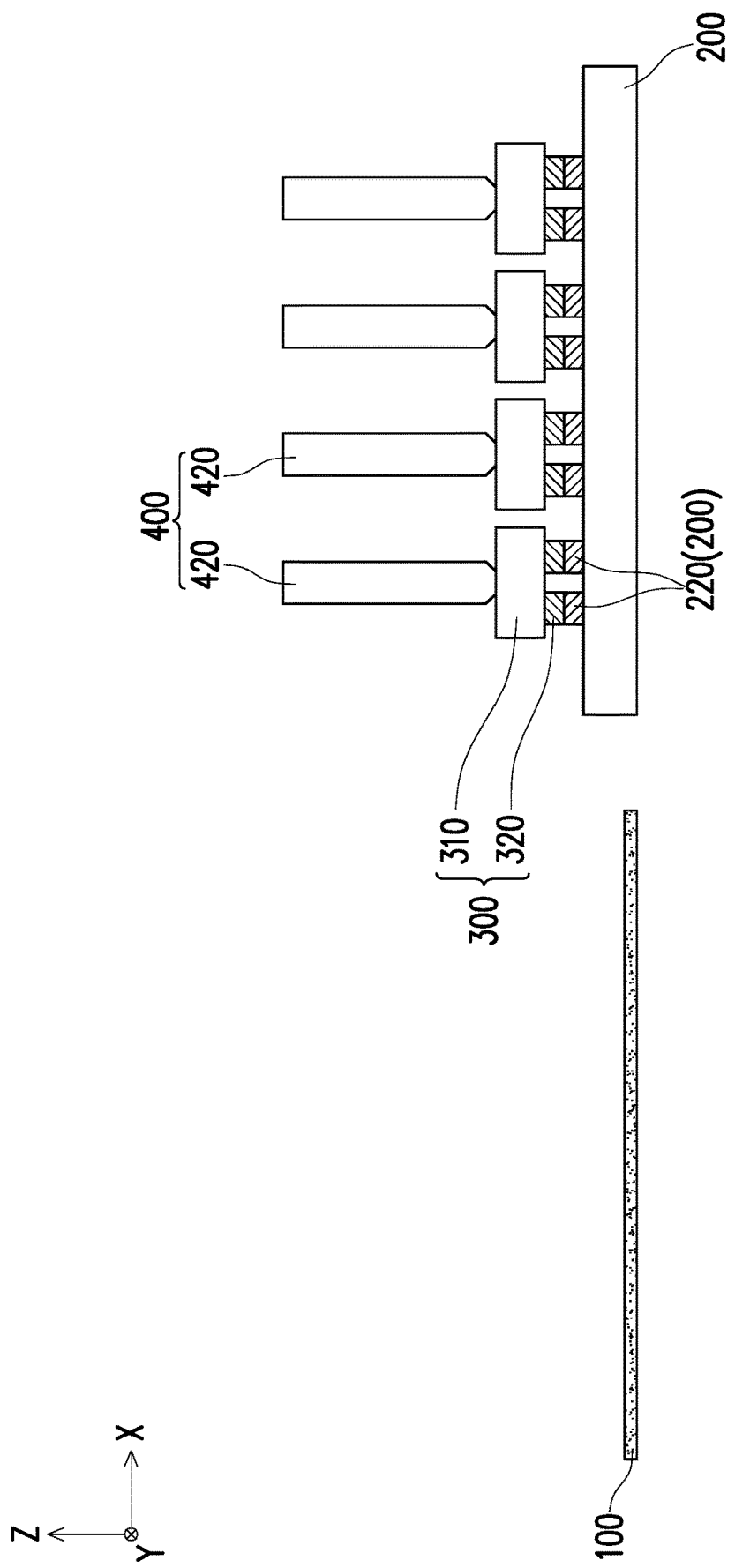

With reference to FIG. 1, FIG. 2 and FIG. 3, next, a transfer device 400 is provided. Then, with the transfer device 400, the semiconductor components 300 are transferred onto the substrate 200. In the step of transferring, at least one conductive bump 320 of each transferred semiconductor component 300 may be docked to the corresponding conductive pad 220.

To be specific, the step of transferring the semiconductor components 300 to the substrate 200 with the transfer device 400 includes the following. The semiconductor components 300 are contacted by the transfer device 400. To be more specific, the transfer device 400 includes a plurality of contact heads 420. The contact heads 420 is, for example, a suction head. The suction head may be a suction head with vacuum attraction or a suction head with magnetic attraction. In other embodiments, the contact heads 420 may be an adhesive contact head or an electrostatic contact head, but not limited thereto. In some other embodiments, the step of providing the transfer device 400 further includes the following. A plurality of transfer devices 400 are provided, but the disclosure is not limited thereto.

Next, the contact heads 420 are moved onto the semiconductor components 300 to be overlapped with the semiconductor components 300 on the Z axis.

Then, the contact heads 420 are moved on the Z axis to be in contact with or in substantial contact with the passive surfaces 312 of the semiconductor components 300. Then, the semiconductor components 300 are respectively sucked by the contact heads 420. For example, the contact heads 420 may suck the semiconductor component 300 by vacuum attraction. In some embodiments, the contact heads 420 may also suck the semiconductor component 300, for example, by magnetic attraction, adhesion, or electrostatic attraction, but not limited thereto.

With reference to FIG. 2, then, the transfer device 400 is moved on the Z axis, such that the contact heads 420 and the semiconductor components 300 sucked by the contact heads 420 depart from the carrier 100. In this way, the semiconductor components 300 may be peeled off from the carrier 100.

Next, the contact heads 420 of the transfer device 400 are moved along a moving direction M on the X axis (or any direction perpendicular to the Z axis) to move the semiconductor components 300 to the above of the substrate 200. In some embodiments, the semiconductor components 300 may be correspondingly overlapped with the conductive pads 220 on the Z axis. In other embodiments, each conductive bump 320 of each of the semiconductor components 300 may be correspondingly overlapped with each of the conductive pads 220 on the Z axis, but not limited thereto.

With reference to FIG. 3, then, the transfer device 400 is moved on the Z axis, such that the contact heads 420 and the semiconductor components 300 sucked by the contact heads 420 approach the substrate 200. The contact heads 420 correspondingly bond the semiconductor components 300 to the conductive pads 220 on the substrate 200.

Then, after the semiconductor components 300 are bonded onto the substrate 200, the contact heads 420 are stopped from sucking the semiconductor components 300. Then, the transfer device 400 is moved on the Z axis, such that the contact heads 420 depart from the substrate 200. For example, stopping sucking the semiconductor components 300 includes stopping the contact heads 420 from performing vacuum attraction. In some embodiments, stopping sucking the semiconductor components 300 also includes stopping the contact heads 420 from performing magnetic attraction or electrostatic attraction, but not limited thereto.

In this way, the contact heads 420 may be removed from the semiconductor components 300.

In other embodiments, through the bonding force between the substrate 200 and the semiconductor component 300 that is greater than the adhesion between the contact heads 420 and the semiconductor components 300, the contact heads 420 may be separated from the semiconductor components 300 when departing from the substrate 200.

Under the above configuration, in the embodiment of the disclosure, the mass transfer process may be achieved on the large-size substrate 200.

Figure 4:
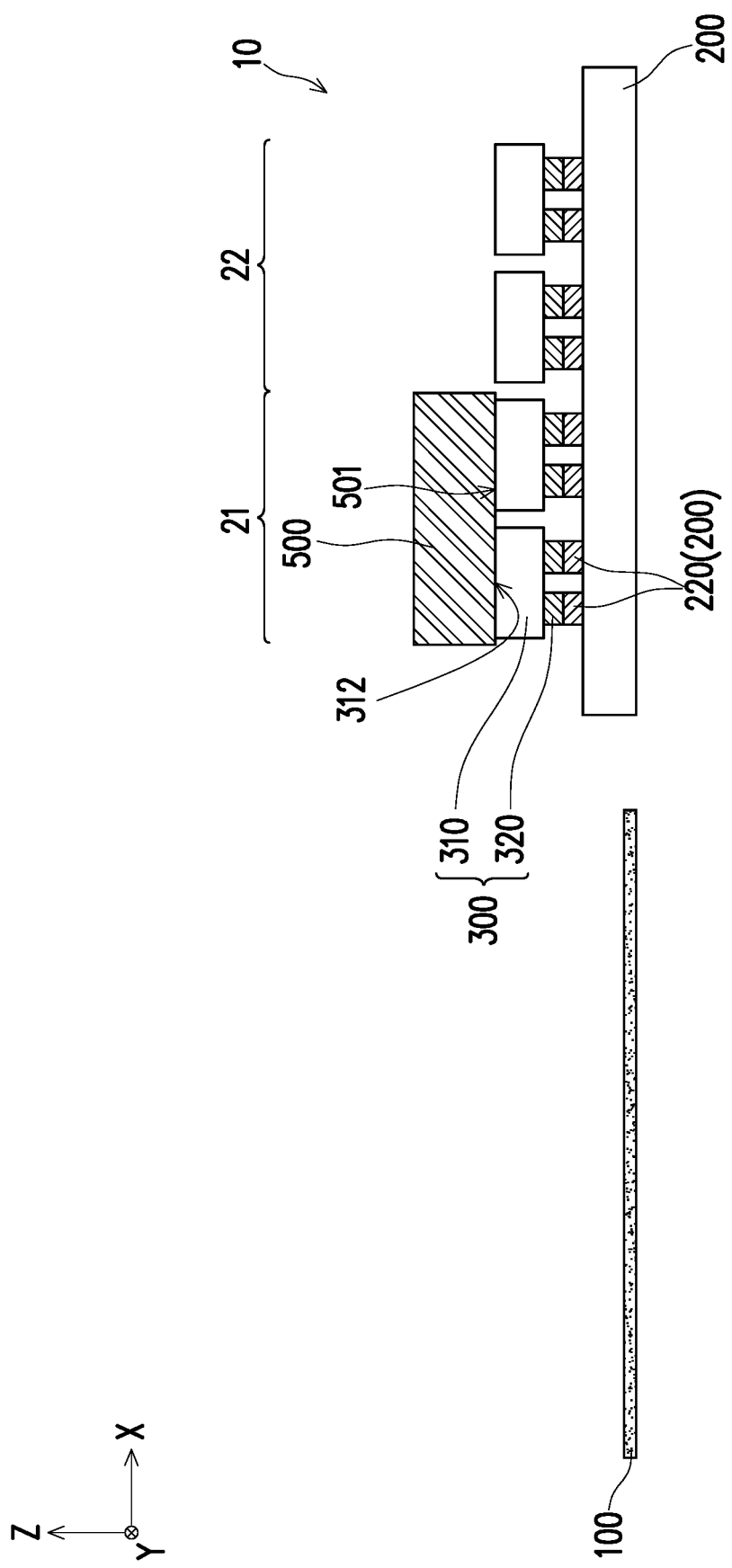

With reference to FIG. 4, next, the semiconductor components 300 is heated or pressurized by using a heating device 500. In some embodiments, the heating device 500 is, for example, one or more heating plates or one or more heating blocks. The heating device 500 includes a minimal heating element, for example, a heating plate having a planer surface 501 facing toward the substrate 200. The heating plate (i.e., the minimal heating element) in the heating device 500 is in contact with the passive surfaces 312 of at least two semiconductor components 300 through the planer surface 501 to perform the step of heating or the step of pressurizing on the at least two semiconductor components 300 at the same time.

In some embodiments, the heating device 500 may perform the step of heating or the step of pressurizing in divided regions. For example, the substrate 200 may be divided into a plurality of regions, such as the region 21 and the region 22. The region 21 and the region 22 may be two adjacent regions. The semiconductor components 300 may be disposed in the region 21 or in the region 22. For example, as shown in FIG. 4, at least two semiconductor components 300 may be disposed in the region 21, and at least two semiconductor components 300 may be disposed in the region 22. Note that, the number of semiconductor components 300 in the region 21 or the region 22 as shown in FIG. 4 is not intended to limit the disclosure. In some embodiments, the number of semiconductor components 300 in the region 21 or the region 22 may be three, four, five, ten, tens, or a greater number, but is not limited thereto. In addition, the number of regions is not limited to that as shown in FIG. 4. In some embodiments, the regions defined on the substrate 200 may include three, four, five, ten, tens of, or more regions, but not limited thereto.

As shown in FIG. 4, the heating device 500 may first be moved to the above of the semiconductor components 300 in the region 21 to be overlapped with the semiconductor components 300 on the Z axis. Next, the heating device 500 is moved on the Z axis to approach the substrate 200. The planer surface 501 of the heating device 500 is in contact with the passive surfaces 312 of the semiconductor components 300. Then, temperature of the heating device 500 may be increased to perform the step of heating on the semiconductor components 300. Alternatively, the heating device 500 may apply force to the semiconductor components 300 to perform the step of pressurizing on the semiconductor components 300. In this way, in the manufacturing method of the semiconductor package 10, the manufacturing process may be simplified or the manufacturing process time may be reduced. In addition, the minimal heating element of the heating device 500 may heat or pressurize multiple semiconductor components 300 or at least two semiconductor components 300 at the same time. Compared with heating on the other side of the substrate 200 opposite to the side where the semiconductor components 300 are disposed, the plurality of semiconductor components 300 are heated through the heating device 500, accelerating the temperature increase or improving uniformity of the temperature increase. Therefore, in the manufacturing process, thermal conductivity may be improved, probability of warping of the substrate 200 may be reduced, or package quality may be enhanced.

In some embodiments, in the step of heating, the semiconductor components 300 may be heated to 25° C. to 350° C. by the heating device 500. In other embodiments, the heating temperature may range from 350° C. to 550° C., but not limited thereto.

In some embodiments, in the step of pressurizing, the pressure applied by the heating device 500 to the semiconductor components 300 may be 0.5 MPa to 40 MPa. In other embodiments, the applied pressure may range from 40 MPa to 100 MPa, but not limited thereto.

Under the above configuration, metal-to-metal docking may be achieved between the conductive bumps 320 of the semiconductor components 300 and the docked conductive pads 220 of the substrate 200. In this way, electrical quality or reliability of the semiconductor package 10 may be improved.

In some embodiments, before the step of correspondingly bonding the semiconductor components 300 onto the substrate 200, a conductive material (not shown) may be selectively disposed on the conductive pads 220 of the substrate 200. The conductive material is solder, for example. Next, the step of correspondingly bonding the semiconductor components 300 onto the substrate 200, and the step of heating or the step of pressurizing are performed. Since a solder may be disposed between the conductive pads 220 and the conductive bumps 320, the temperature range of heating by the heating device 500 may be further reduced, or the heating temperature may be substantially similar to room temperature, but not limited thereto. Alternatively, the pressure applied by the heating device 500 may be further reduced. Under the above configuration, probability of damage to the semiconductor components 300 may be reduced, and the yield of the heating device 500 in the manufacturing process may be further improved or quality of the heating device 500 may be enhanced.

Figure 5:
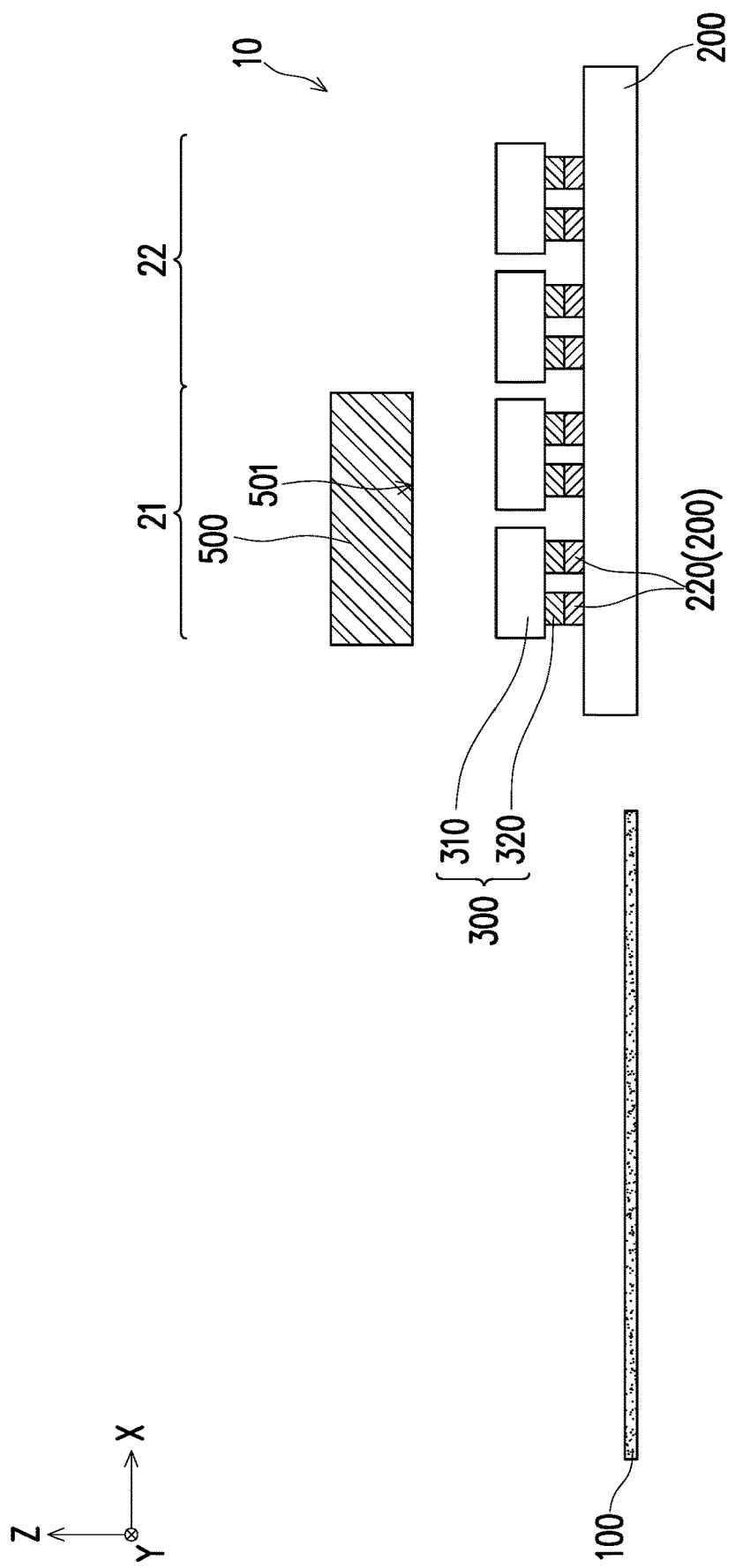
Figure 6:
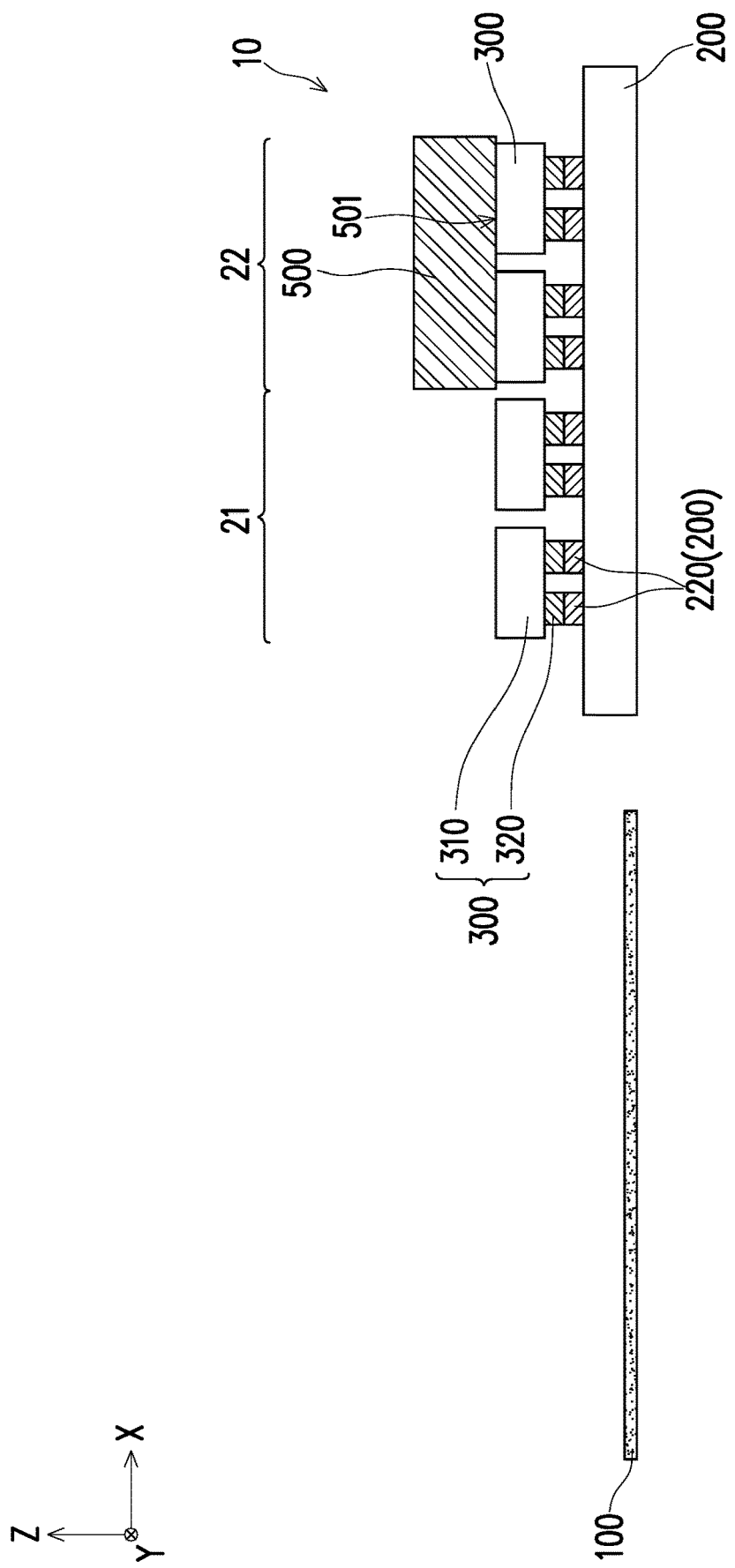

With reference to FIG. 5 and FIG. 6, next, the heating device 500 is moved on the Z axis to depart from the substrate 200.

Then, the heating device 500 is moved on the X axis to the above of the semiconductor components 300 in the region 22 to be overlapped with the semiconductor components 300 on the Z axis. Next, the heating device 500 is moved on the Z axis to approach the substrate 200. The planer surface 501 of the heating device 500 is in contact with the semiconductor components 300. Then, the temperature of the heating device 500 may be increased to perform the step of heating on the semiconductor components 300 in the region 22. Alternatively, the heating device 500 may apply force to the semiconductor components 300 to perform the step of pressurizing on the semiconductor components 300 in the region 22. The step of heating or the step of pressurizing described in this paragraph is similar to the step of heating or the step of pressurizing described in the previous paragraphs, and will not be repeatedly described herein. After the step of heating or the step of pressurizing, metal-to-metal docking may be achieved between the conductive bumps 320 of the semiconductor components 300 and the docked conductive pads 220. In this way, electrical quality or reliability of the semiconductor package 10 may be improved.

In some embodiments, may the step of heating or the step of pressurizing may be performed on the semiconductor components 300 in other regions by using the heating device 500. Nonetheless, the disclosure is not limited thereto.

In other embodiments, a plurality of heating devices 500 may also be provided at the same time to perform the step of heating or the step of pressurizing on the semiconductor components 300 in different regions. In still other embodiments, it is also possible to perform the step of heating or pressurizing by the heating devices 500 without region-division, which is not limited by the disclosure.

Figure 7:
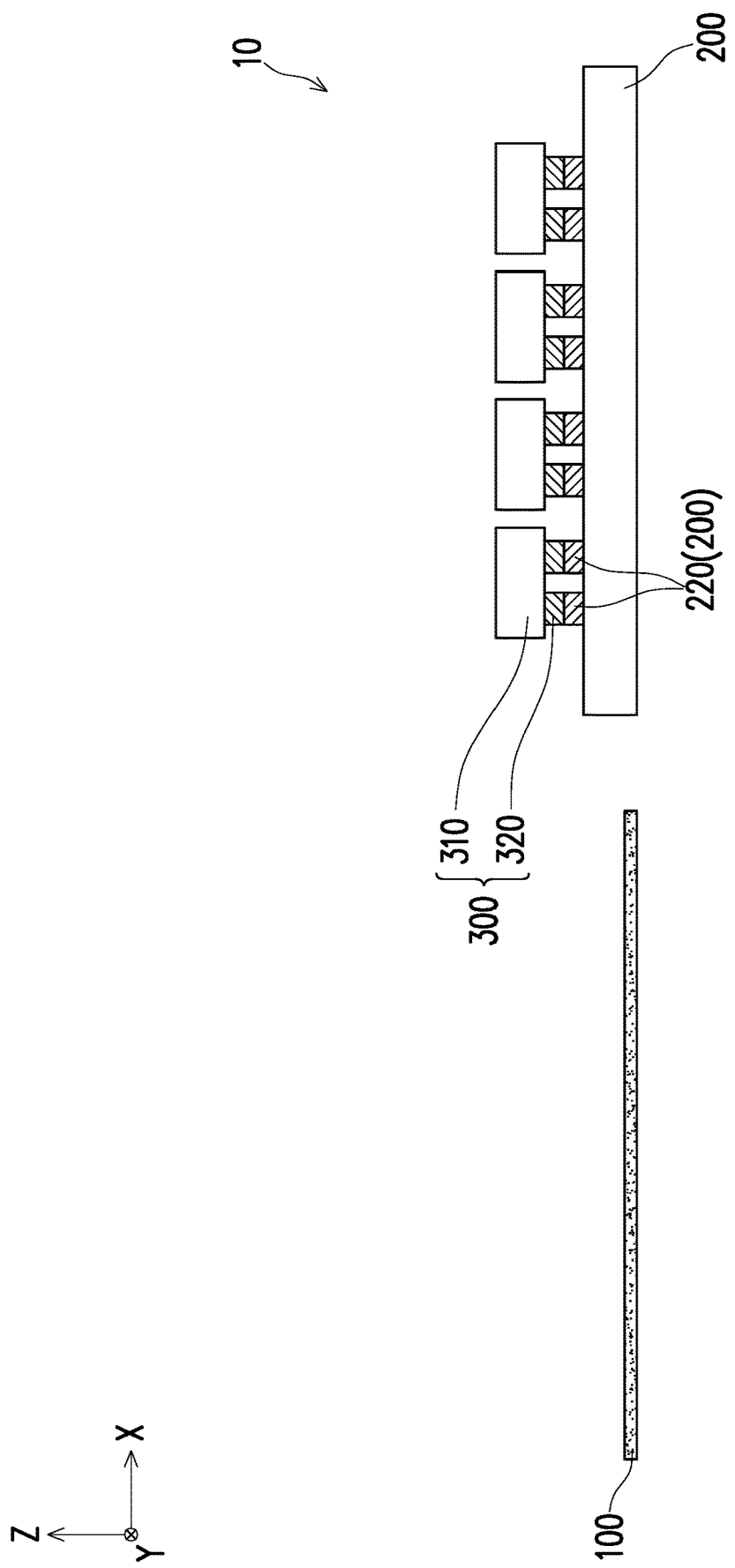

With reference to FIG. 7, after the step of heating or the step of pressurizing is completed, the heating device 500 may be moved on the Z axis to remove the heating device 500. So far, the manufacturing of the semiconductor package 10 has been completed.

Notably, in the manufacturing method of the semiconductor package 10 according to an embodiment of the disclosure, since the mass transfer process may be performed on the substrate 200 of a panel-level large size, the manufacturing process of the semiconductor package 10 may be simplified or the manufacturing process time may be reduced. Then, through the minimal heating element of the heating device 500, the step of heating or the step of pressurizing may be performed on the plurality of semiconductor components 300 or at least two semiconductor components 300, simplifying the manufacturing process or reducing the manufacturing process time. In addition, compared with heating on the other side of the substrate 200 opposite to the side where the semiconductor components 300 are disposed, in the embodiment of the disclosure, the plurality of semiconductor components 300 are heated through the heating device 500, accelerating the temperature increase or improving uniformity of the temperature increase for the semiconductor package 10 on the whole. Therefore, in the manufacturing process, thermal conductivity may be improved, probability of warping of the substrate 200 may be reduced, or package quality may be enhanced. Furthermore, metal-to-metal docking may be achieved between the conductive pads 220 and the conductive bumps 320 of the semiconductor package 10, improving electrical quality or reliability of the semiconductor package 10.

In the following, other embodiments will be provided for describing manufacturing methods. Note that, the reference numerals and part of the contents in the above embodiments remain to be used in following embodiments, where the same reference numerals are adopted to refer to the same or similar elements, and description of the same technical contents is omitted. Reference may be made to the above embodiments for the description of the omitted part, which will not be repeatedly described in the following embodiments.

Figure 8:
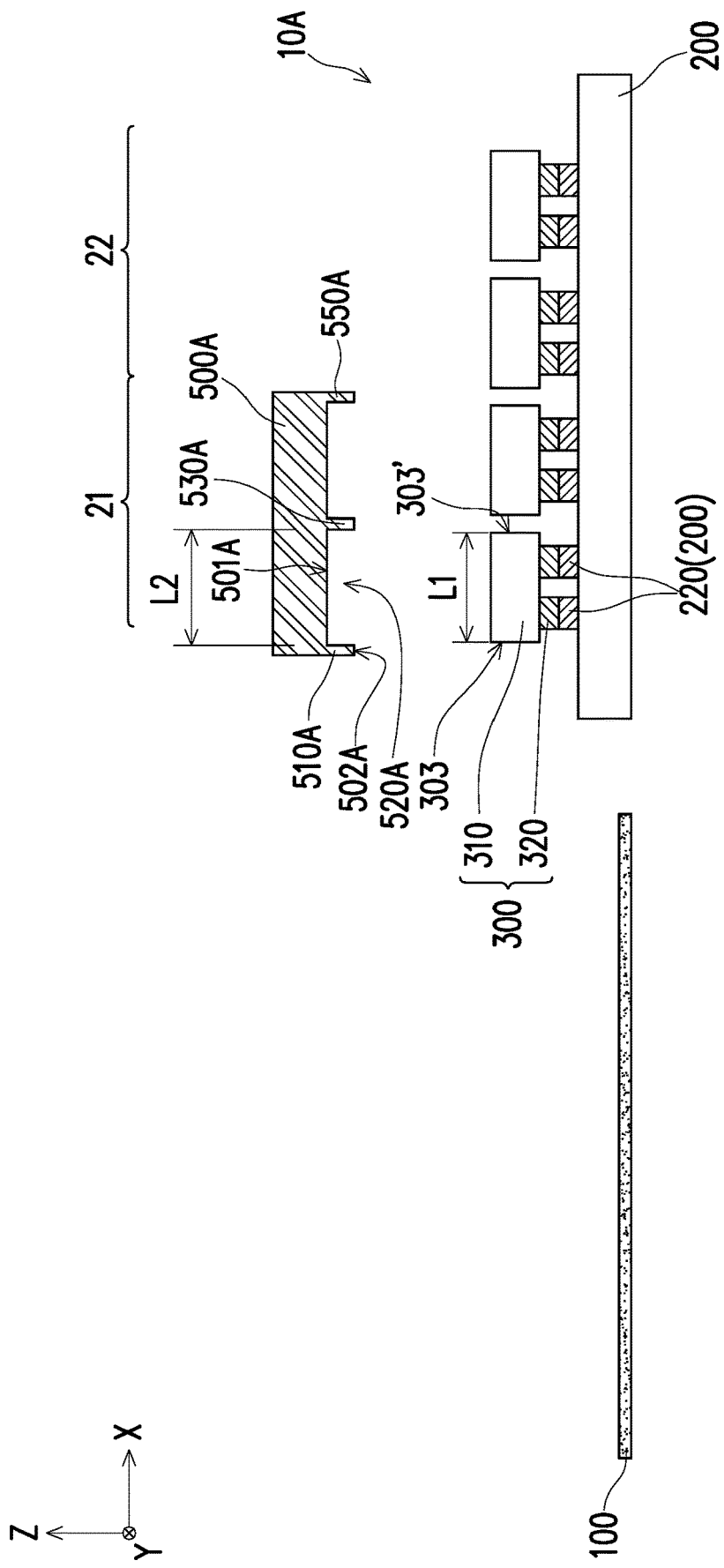
FIG. 8 to FIG. 9 are schematic cross-sectional views of a manufacturing process of a semiconductor package according to another embodiment of the disclosure.
Figure 9:
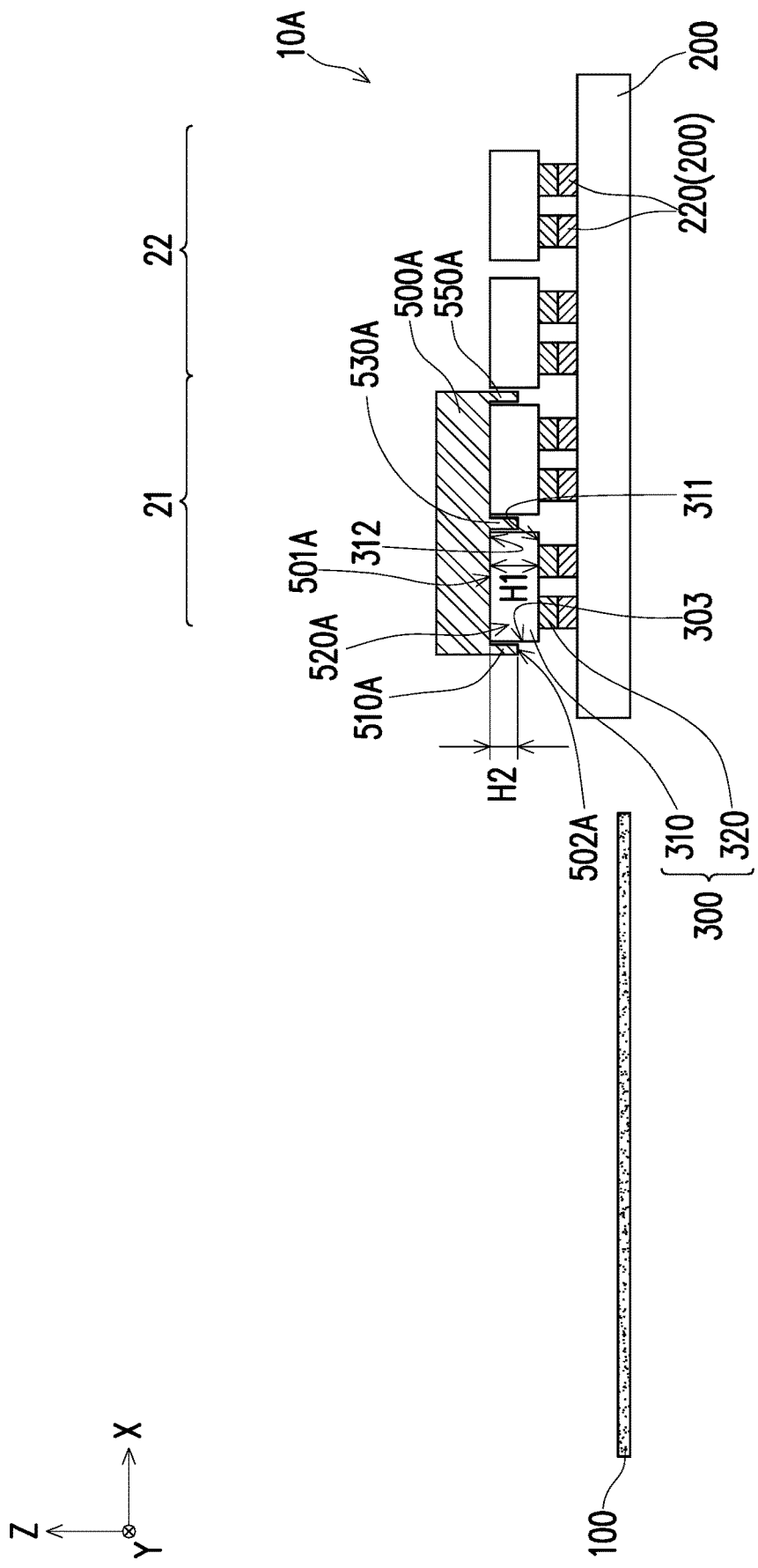

FIG. 8 to FIG. 9 are schematic cross-sectional views of a manufacturing process of a semiconductor package according to another embodiment of the disclosure. For clarity of the drawings and ease of description, illustration of some components is omitted in FIG. 8 and FIG. 9. The difference between the manufacturing method according to this embodiment and the manufacturing method of the semiconductor package 10 of FIG. 1 lies in that, in a manufacturing method of a semiconductor package 10A, a heating device 500A as adopted has a plurality of grooves 520A. For example, the heating device 500A has an outer side wall 510A, an outer side wall 550A, and a separator 530A. The outer side wall 510A and the outer side wall 550A are respectively two opposite outer edges of the heating device 500A. The separator 530A is disposed between the outer side wall 510A and the outer side wall 550A. The outer side wall 510A and the separator 530A may be connected by a planer surface 501A located at the bottom of the heating device 500A. The outer side wall 550A and the separator 530A may be connected by the planer surface 501A located at the bottom of the heating device 500A. Under the above configuration, the outer side wall 510A, the separator 530A, and the planer surface 501A may surround the groove 520A. The outer side wall 550A, the separator 530A, and the planer surface 501A may surround the groove 520A.

From another perspective, the groove 520A may be regarded as an accommodating space having depth on the heating device 500A. For example, the outer side wall 510A has a bottom surface 502A. On the Z axis, the bottom surface 502A and the planer surface 501A are respectively located on different levels, and thus a height difference is present. In other words, the depth of the groove 520A may be defined by the height difference between the planer surface 501A and the bottom surface 502A.

In this embodiment, on the Z axis (e.g., in the top view direction), the outer contour of each semiconductor component 300 is, for example, a rectangle or other suitable shapes. The rectangle may include a square or other rectangles. That is, the semiconductor component 300 includes length and width (the length of the semiconductor component 300 is shown in the cross-sectional view of FIG. 8). For example, a length L1 of the semiconductor component 300 may be defined as the shortest distance between two opposite side walls 303 and 303' of the main body 310 on the X axis. Similar to the definition of the length L1 of the semiconductor component 300, the width of the semiconductor component 300 (not shown) may be defined as the shortest distance between two opposite side walls of the main body 310 on the Y axis.

On the Z axis (e.g., in the top view direction), the outer contour of each groove 520A is, for example, a rectangle or other suitable shapes. The rectangle may include a square or other rectangles. That is, the groove 520A includes length and width (the length of the groove 520A is shown in the cross-sectional view of FIG. 8). In some embodiments, the outer contour of the groove 520A corresponds to the outer contour of the semiconductor component 300, but not limited thereto. For example, a length L2 of the groove 520A may be defined as the shortest distance from the inner edge of the outer side wall 510A to the side of the side wall 530A close to the outer side wall 510A on the X axis. From another perspective, the length L2 of the groove 520A may be defined as the shortest distance of extension of the groove 520A on the X axis. Similar to the definition of the length L2 of the groove 520A, the width of the groove 520A (not shown) may be defined as the shortest distance from the inner edge of the outer side wall to the side of the side wall close to the outer side wall on the Y axis, or the shortest distance of extension of the groove 520A on the Y axis.

In some embodiments, the length L2 of the groove 520A is 105% to 115% of the length L1 of the corresponding semiconductor component 300. In other words, the length L2 of the groove 520A is greater than the length L1 of the semiconductor component 300. In other embodiments, the width of the groove 520A is 105% to 115% of the width of the corresponding semiconductor component 300. In other words, the width of the groove 520A is larger than the width of the semiconductor component 300. In other words, the area (for example: length×width) of the groove 520A is greater than the area of the semiconductor component 300. In this way, when the groove 520A is overlapped with the semiconductor component 300 on the Z axis, the outer contour of the semiconductor component 300 is located within the outer contour of the groove 520A.

Under the above configuration, the heating device 500A may be overlapped with the semiconductor components 300 in the region 21 on the Z axis. The grooves 520A may be respectively overlapped with the semiconductor components 300.

With reference to FIG. 9, next, the heating device 500A is moved on the Z axis to approach the substrate 200. The semiconductor components 300 are respectively aligned with the grooves 520A. When the planer surface 501A of the heating device 500A is in contact with the passive surfaces 312 of the semiconductor components 300, the semiconductor components 300 are respectively correspondingly accommodated in the grooves 520A. Then, a step of heating or a step of pressurizing is performed on the semiconductor components 300.

In some embodiments, the outer side wall 510A or the separator 530A surrounding the groove 520A may completely cover the side wall 303 of the semiconductor component 300 on the Z axis. In other embodiments, the outer side wall 510A or the separator 530A may partially cover the side wall 303 of the semiconductor component 300 on the Z axis. For example, a thickness H1 of the semiconductor component 300 may be greater than a depth H2 of the groove 520A. The thickness H1 of the semiconductor component 300 may be defined as the least height of the main body 310 on the Z axis, or the shortest distance between the active surface 311 and the passive surface 312 on the Z axis. The depth H2 of the groove 520A may be defined as the height difference between the planer surface 501A and the bottom surface 502A on the Z axis, or the shortest distance between the planer surface 501A and bottom surface 502A on the Z axis. In some embodiments, the depth H2 of the groove 520A is 80% to 90% of the thickness H1 of the semiconductor component 300.

In other embodiments, the depth H2 of the groove 520A may also be greater than or equal to the thickness H1 of the semiconductor component 300. Under the above configuration, the depth H2 of the groove 520A is greater than the thickness H1 of the semiconductor component 300, but is not limited thereto.

Next, in the step of heating the semiconductor components 300, heating is performed through the groove 520A on the side wall 303 of the semiconductor component 300 accommodated in the groove 520A.

Notably, in the manufacturing method of the semiconductor package 10A according to an embodiment of the disclosure, since heating may be performed through the minimal heating element of the heating device 500A on the plurality of semiconductor components 300 in the grooves 520A of the heating device 500A, heating may be performed through the outer side wall 510A, the outer side wall 550A, or the separator 530A on the side wall 303 of the semiconductor components 300. In this way, in the manufacturing method of the semiconductor package 10A according to the embodiment of the disclosure, heating efficiency on the side wall 303 of the semiconductor component 300 may be increased, accelerating the temperature increase or improving uniformity of the temperature increase. In addition, compared with heating on the other side of the substrate 200 opposite to the side where the semiconductor components 300 are disposed, in the embodiment of the disclosure, the plurality of semiconductor components 300 is heated through the heating device 500A, accelerating the temperature increase or improving uniformity of the temperature increase for the semiconductor package 10A on the whole.

Under the above configuration, in the manufacturing process of the semiconductor package 10A, thermal conductivity may be improved, probability of warping of the substrate 200 may be reduced, or package quality may be enhanced. Moreover, the manufacturing process of the semiconductor package 10A may be simplified or the manufacturing process time may be reduced. Furthermore, part of the above technical effects may be achieved for the semiconductor package 10A.

In some embodiments, the heating device 500A may then be moved to the region 22, and the step of heating or the step of pressurizing may next be performed on the semiconductor components 300 in the region 22 by using the heating device 500A, but the disclosure is not limited thereto. In other embodiments, the step of heating or the step of pressurizing may next be performed on the semiconductor components 300 in other regions by using the heating device 500A, but the disclosure is not limited thereto.

Figure 10:
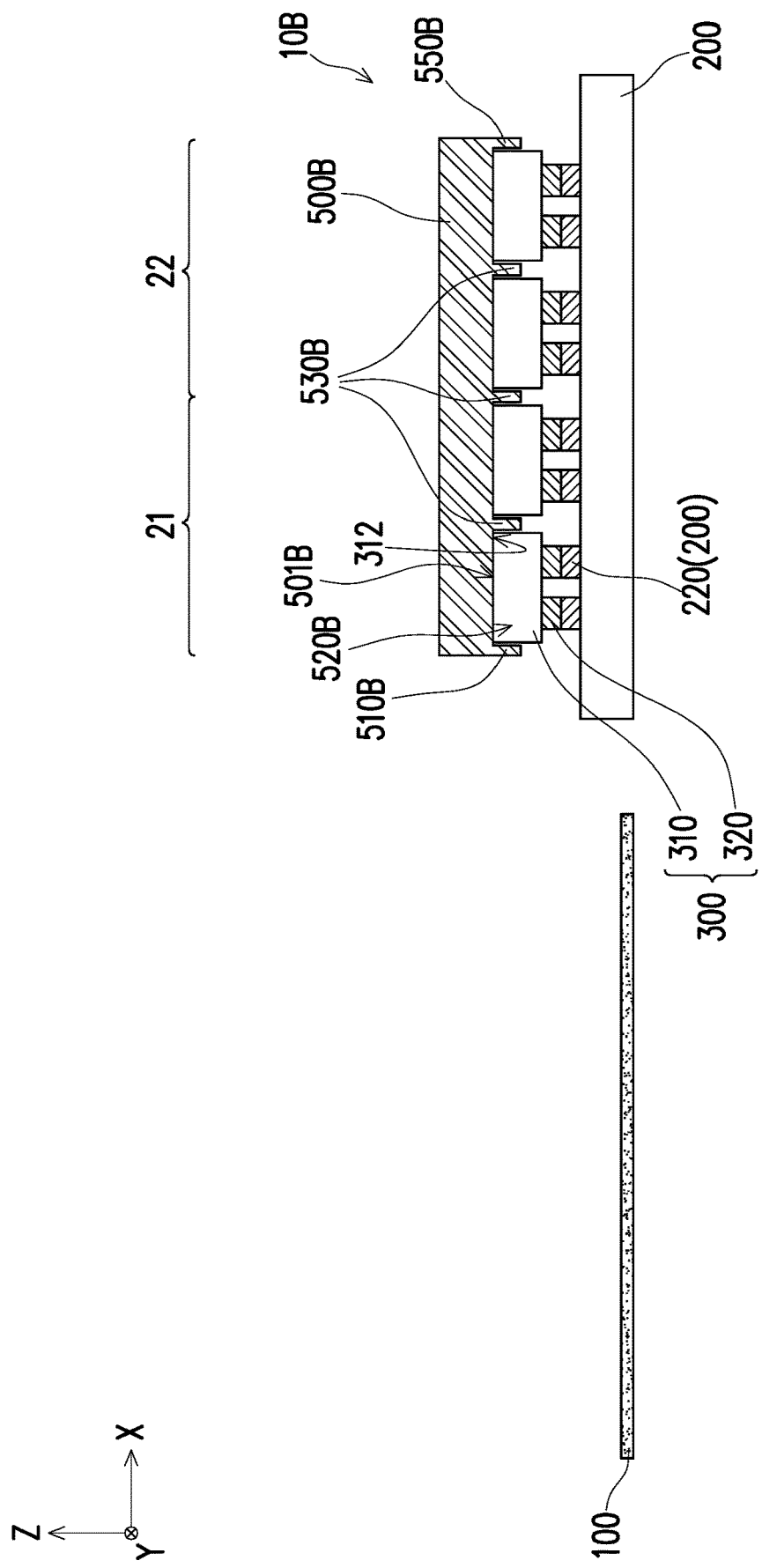
FIG. 10 is a schematic cross-sectional view of a manufacturing process of a semiconductor package according to still another embodiment of the disclosure.

FIG. 10 is a schematic cross-sectional view of a manufacturing process of a semiconductor package according to still another embodiment of the disclosure. For clarity of the drawings and ease of description, illustration of some components is omitted in FIG. 10. The difference between the manufacturing method according to this embodiment and the manufacturing method of the semiconductor package 10A of FIG. 8 or FIG. 9 lies in that, in a manufacturing method of a semiconductor package 10B, a heating device 500B as adopted may be overlapped with multiple regions. For example, the heating device 500B may be overlapped with the region 21 and the region 22, and overlapped with the semiconductor components 300 in the region 21 and the region 22 on the Z axis. In other embodiments, the heating device 500B may be overlapped with two or more regions. In still other embodiments, the heating device 500B may be overlapped with each of the regions on the substrate 200 or overlapped with the substrate 200 in the entire surface, but not limited thereto.

As shown in FIG. 10, the heating device 500A has an outer side wall 510B, an outer side wall 550B, and a plurality of separators 530B. The outer side wall 510B is located in the part of the heating device 500B overlapped with the region 21. The outer side wall 550B is located in the part of the heating device 500B overlapped with the region 22. The outer side wall 510B and the outer side wall 550A are respectively two opposite outer edges of the heating device 500B. The separators 530B are disposed between the outer side wall 510B and the outer side wall 550B. The outer side wall 510B and the separator 530B may be connected by a planer surface 501B located at the bottom of the heating device 500B. The outer side wall 550B and the separator 530B may be connected by the planer surface 501B located at the bottom of the heating device 500B. The separators 530B may be connected by the planer surface 501B. Under the above configuration, the outer side wall 510B, the separator 530B, and the planer surface 501B may surround a groove 520B. The outer side wall 550B, the separator, 530B and the planer surface 501B may surround the groove 520B. Two adjacent separators 530B and the planer surface 501B connecting the two adjacent separators 530B may surround the groove 520B. In other words, the groove 520B may be regarded as an accommodating space having depth on the heating device 500B.

In this embodiment, on the Z axis (e.g., in the top view direction), the outer contour of each semiconductor component 300 is, for example, a rectangle or other suitable shapes. The rectangle may include a square or other rectangles. The outer contour of each groove 520B is, for example, a rectangle or other suitable shapes. The rectangle may include a square or other rectangles. In other words, the outer contour of the groove 520B corresponds to the outer contour of the semiconductor component 300, but not limited thereto. Under the above configuration, the grooves 520B of the heating device 500B may respectively be correspondingly overlapped with the semiconductor components 300 in the region 21 and the region 22 on the Z axis.

In this way, in the manufacturing method of the semiconductor package 10B according to an embodiment in the disclosure, since heating may be performed by the minimal heating element of the heating device 500B on the plurality of semiconductor components 300 in the grooves 520B of the heating device 500B, heating may be performed through the outer side wall 510B, the outer side wall 550B, or the separators 530B on the side wall of the semiconductor components 300. In this way, in the manufacturing method of the semiconductor package 10B of the embodiment of the disclosure, heating efficiency on the side wall of the semiconductor component 300 may be increased, accelerating the temperature increase or improving uniformity of the temperature increase. In addition, compared with heating on the other side of the substrate 200 opposite to the side where the semiconductor components 300 are disposed, in the embodiment of the disclosure, the plurality of semiconductor components 300 are heated through the heating device 500B, accelerating the temperature increase or improving uniformity of the temperature increase for the semiconductor package 10B on the whole. Under the above configuration, in the manufacturing process of the semiconductor package 10B, thermal conductivity may be improved, probability of warping of the substrate 200 may be reduced, or package quality may be enhanced. Moreover, the manufacturing process of the semiconductor package 10B may be simplified or the manufacturing process time may be reduced. Furthermore, part of the above technical effects may be achieved for the semiconductor package 10B.

Besides, the heating device 500B may be overlapped with multiple regions (e.g., the region 21 and the region 22) at the same time. Therefore, the heating device 500B may perform the step of heating or the step of pressurizing on the semiconductor components 300 in multiple regions at the same time. In other embodiments, the heating device 500B may perform the step of heating or the step of pressurizing on substantially all of the semiconductor component 300 on the substrate 200, but the disclosure is not limited thereto. Therefore, the manufacturing process of the semiconductor package 10B may be simplified or the manufacturing process time may be reduced.

In summary of the foregoing, in the manufacturing method of a semiconductor package according to an embodiment of the disclosure, since multiple semiconductor components may be transferred onto the substrate, the mass transfer process may be achieved on a large-size substrate. In this way, the manufacturing process of the semiconductor package may be simplified or the manufacturing process time may be reduced. In addition, the step of heating or the step of pressurizing may be performed on the plurality of semiconductor components through the heating device in the manufacturing process, further simplifying the manufacturing process or reducing the manufacturing process time. Moreover, compared with heating on the other side of the substrate opposite to the side where the semiconductor components are disposed, in the embodiment of the disclosure, the plurality of semiconductor components are heated through the heating device, accelerating the temperature increase or improving uniformity of the temperature increase for the semiconductor package on the whole. Therefore, in the manufacturing process, thermal conductivity may be improved, probability of warping of the substrate may be reduced, or package quality may be enhanced. Furthermore, metal-to-metal docking may be achieved between the conductive pads and the conductive bumps of the semiconductor package, improving electrical quality or reliability of the semiconductor package.

Besides, heating may be performed on multiple semiconductor components in the grooves of the heating device, so heating may be performed on the side walls of the semiconductor components. In this way, in the manufacturing method of the semiconductor package, heating efficiency on the side wall of the semiconductor component may be increased, accelerating the temperature increase or improving uniformity of the temperature increase for the semiconductor package on the whole. Under the above configuration, in the manufacturing process of the semiconductor package, thermal conductivity may be improved, probability of warping of the substrate may be reduced, or package quality may be enhanced.

Finally, it should be noted that the foregoing embodiments are used only to describe, but not limit, the technical solutions of the disclosure. Although the disclosure has been described in detail with reference to the foregoing embodiments, people having ordinary skill in the art should understand that the technical solutions described in the foregoing embodiments may still be modified, or that some or all technical features therein may be equivalently replaced. However, the nature of the corresponding technical solutions so modified or replaced does not depart from the scope of the technical solutions of the embodiments of the disclosure.

What is claimed is:

1. A manufacturing method of a semiconductor package, comprising:
   providing a plurality of semiconductor components, wherein each of the semiconductor components has at least one conductive bump;
   providing a substrate having a plurality of conductive pads;
   providing a transfer device;
   transferring the semiconductor components onto the substrate by the transfer device;
   providing a heating device; and
   heating or pressurizing at least two of the semiconductor components by the heating device,
   wherein, in the step of transferring the semiconductor components onto the substrate, the at least one conductive bump of each of the semiconductor components is docked to corresponding ones of the conductive pads,
   wherein the heating device has a plurality of grooves, and the semiconductor components are correspondingly accommodated in the grooves when the heating device is in contact with the semiconductor components to perform the step of heating or pressurizing,
   wherein a depth of each of the grooves is 80% to 90% of a thickness of each of the semiconductor components.

2. The manufacturing method according to claim 1, wherein the heating device has a planer surface, and the heating device is in contact with the semiconductor components through the planer surface to perform the step of heating or pressurizing.

3. The manufacturing method according to claim 1, wherein in the step of heating, the grooves perform heating on side walls of the semiconductor components accommodated in the grooves.

4. The manufacturing method according to claim 1, wherein a length of each of the grooves is 105% to 115% of a length of each of the semiconductor components, and a width of each of the grooves is 105% to 115% of a width of each of the semiconductor components.

5. The manufacturing method according to claim 1, wherein in the step of heating, the semiconductor components are heated to 25° C. to 350° C., or in the step of pressurizing, a pressure applied to the semiconductor components is 0.5 MPa to 40 MPa.

6. The manufacturing method according to claim 1, wherein the step of transferring by the transfer device comprises:
sucking the semiconductor components by a plurality of contact heads, wherein the transfer device comprises the contact heads;
moving the contact heads to move the semiconductor components to the above of the substrate; and
bonding the semiconductor components to the conductive pads on the substrate by the contact heads.

7. The manufacturing method according to claim 6, wherein the step of transferring by the transfer device further comprises, after bonding the semiconductor components onto the substrate, removing the contact heads from the semiconductor components.

8. The manufacturing method according to claim 1, wherein the heating device comprises a minimal heating element, and the minimal heating element heats or pressurizes at least two of the semiconductor components at the same time.

9. A manufacturing method of a semiconductor package, comprising:
providing a plurality of semiconductor components, wherein each of the semiconductor components has at least one conductive bump;
providing a substrate having a plurality of conductive pads, wherein the substrate is divided into a first region and a second region, and the conductive pads are located in the first region and the second region;
providing a transfer device;
transferring the semiconductor components onto the substrate by the transfer device, wherein the semiconductor components are disposed in the first region and the second region;
providing a heating device;
heating or pressurizing at least two of the semiconductor components in the first region or the second region by the heating device; and
removing the heating device,
wherein, in the step of transferring the semiconductor components onto the substrate, the at least one conductive bump of each of the semiconductor components is docked to corresponding ones of the conductive pads,
wherein the heating device has a plurality of grooves, and the semiconductor components are correspondingly accommodated in the grooves when the heating device is in contact with the semiconductor components to perform the step of heating or pressurizing,
wherein in the step of heating, the grooves perform heating on side walls of the semiconductor components accommodated in the grooves.

10. The manufacturing method according to claim 9, wherein the heating device comprises a heating plate or a heating block having a planer surface, the planer surface faces toward the substrate and is in contact with passive surfaces of the semiconductor components to perform the step of heating or the step of pressurizing on the semiconductor components at the same time.

11. The manufacturing method according to claim 9, wherein the heating device heats or pressurizes the semiconductor components in the first region and the second region at the same time.

12. The manufacturing method according to claim 9, wherein the step of heating by the heating device further comprises:
moving the heating device to the above of the semiconductor components in the first region or the second region;
causing the heating device to approach the substrate, wherein a planer surface of the heating device is in contact with passive surfaces of the semiconductor components;
increasing the temperature of the heating device to heat the semiconductor components.

13. The manufacturing method according to claim 9, wherein the step of pressurizing by the heating device further comprises:
moving the heating device to the above of the semiconductor components in the first region or the second region;
causing the heating device to approach the substrate, wherein a planer surface of the heating device is in contact with passive surfaces of the semiconductor components;
causing the heating device to apply force to the semiconductor components to pressurize the semiconductor components.

14. The manufacturing method according to claim 9, wherein in the step of heating, the semiconductor components are heated to 350° C. to 550° C., or in the step of pressurizing, a pressure applied to the semiconductor components is 0.5 MPa to 40 MPa.

15. The manufacturing method according to claim 9, wherein in the step of pressurizing, a pressure applied to the semiconductor components is 40 MPa to 100 MPa.

16. The manufacturing method according to claim 9, further comprising:
before the step of transferring the semiconductor components onto the substrate, disposing a conductive material on the conductive pads,
wherein in the step of heating or pressurizing, the conductive material is disposed between the conductive pads and a corresponding one of the at least one conductive bump.

17. A manufacturing method of a semiconductor package, comprising:
providing a plurality of semiconductor components, wherein each of the semiconductor components has at least one conductive bump;
providing a substrate having a plurality of conductive pads;
providing a transfer device;
transferring the semiconductor components onto the substrate by the transfer device;
providing a heating device; and
heating or pressurizing at least two of the semiconductor components by the heating device,
wherein, in the step of transferring the semiconductor components onto the substrate, the at least one conductive bump of each of the semiconductor components is docked to corresponding ones of the conductive pads, wherein the heating device has a plurality of grooves, and the semiconductor components are correspondingly accommodated in the grooves when the heating device is in contact with the semiconductor components to perform the step of heating or pressurizing, wherein in the step of heating, the grooves perform heating on side walls of the semiconductor components accommodated in the grooves.

\* \* \* \* \*